United States Patent [19]
Moise

[11] Patent Number: 5,442,194
[45] Date of Patent: Aug. 15, 1995

[54] ROOM-TEMPERATURE TUNNELING HOT-ELECTRON TRANSISTOR

[75] Inventor: Theodore S. Moise, Dallas, Tex.

[73] Assignee: Texas Instruments Incorporated, Dallas, Tex.

[21] Appl. No.: 178,676

[22] Filed: Jan. 7, 1994

[51] Int. Cl.⁶ .................. H01L 29/161; H01L 29/72; H01L 27/12

[52] U.S. Cl. ........................ 257/29; 257/26; 257/194; 257/198; 257/769

[58] Field of Search ............... 257/20, 24, 26, 29, 257/194, 196, 197, 198, 201, 758, 769

[56] References Cited

U.S. PATENT DOCUMENTS

| | | | |
|---|---|---|---|
| 4,868,418 | 9/1989 | Imamura et al. | 257/25 |
| 4,901,122 | 2/1990 | Xu et al. | 257/26 |
| 5,100,835 | 3/1992 | Zheng | 257/769 |
| 5,214,297 | 5/1993 | Imamura et al. | 257/197 |
| 5,266,818 | 11/1993 | Tsuda et al. | 257/197 |

FOREIGN PATENT DOCUMENTS 1-214164  8/1989  Japan ..................... 257/26

OTHER PUBLICATIONS

Yokoyama et al, "Tunneling Hot Electron Transistor Using GaAs/AlGaAs Hetero Junctions," Jap. J. Appl. Phys., vol. 23, No. 5, May 1984, pp. L311–L312.

Yokoyama, Naoki, et al., *Resonant-Tunneling Hot-Electron Transistors*, Hot Carriers in Semiconductor Nanostructures Physics and Applications, 1992, pp. 443–466.

Yokoyama, Naoki, et al., *A New Functional, Resonant-Tunneling Hot Electron Transistor (RHET)*, Japanese Journal of Applied Physics, vol. 24, No. 11, Nov. 1985, pp. L853–L854.

Heiblum, M., et al., *Evidence of Hot-Electron Transfer into an Upper Valley in GaAs*, Physical Review Letters, vol. 56, No. 26, Feb. 1986, pp. 2854–2857.

Heiblum, M., et al., *Direct Observation of Ballistic Transport in GaAs*, Physical Review Letters, vol. 55, No. 20, Aug. 1985, pp. 2200–2203.

*Primary Examiner*—Mahshid D. Saadat
*Attorney, Agent, or Firm*—Carlton H. Hoel; Richard L. Donaldson

[57] ABSTRACT

A hot-electron transistor (10) is formed on substrate (12) having an outer surface. The present transistor includes subcollector layer (14) comprising Indium Gallium Arsenide formed outwardly from the outer surface of substrate (12). Collector barrier layer (18) comprising Indium Aluminum Gallium Arsenide is outwardly formed from subcollector layer (14), and collector barrier layer (18) minimizes leakage current in transistor (10). Outwardly from collector barrier layer (18) is formed base layer (20) comprising Indium Gallium Arsenide. Tunnel injector layer (21) comprising Aluminum Arsenide for ballistically transporting electrons in transistor (10) is outwardly formed from base layer (20), and emitter layer (24) comprising Indium Aluminum Arsenide is outwardly formed from tunnel injector layer (21).

18 Claims, 2 Drawing Sheets

ROOM-TEMPERATURE TUNNELING HOT-ELECTRON TRANSISTOR

GOVERNMENT RIGHTS

The U.S. Government has a paid up license in this invention and rights in limited circumstances to require the patent owner to license others on reasonable terms provided by the terms of the Contract No. N00014-90-C-0161.

TECHNICAL FIELD OF THE INVENTION

This invention relates in general to the field of electronic devices, and more particularly, to a room-temperature tunneling hot-electron transistor.

BACKGROUND OF THE INVENTION

Tunneling hot-electron transistors are quantum-effect devices because certain structures within the transistors are typically less than 100 Å. Tunneling hot-electron transistors operate by injecting high energy electrons from the emitter into the base of the transistor by a tunnel injector interposed between the emitter and base. By applying a potential to the emitter-base junction, the tunnel injector provides sufficient energy to the electrons in the emitter so that the electrons are transported across the base to the collector of the transistor. The injected high energy electrons from the emitter are referred to as hot-electrons. The injection of hot-electrons into the base provides the gain of a hot-electron transistor. Tunneling hot-electron transistors are desirable for their small size, high gain, high speed, and low operating voltages.

Currently available tunneling hot-electron transistors do not operate effectively at room temperature (300° K.). Previously developed tunneling hot-electron transistors require cooling (typically 77° K.) before they are functional. This requirement of cooling is a major limitation on the practicality of conventional tunneling hot-electron devices. Cooling the transistors generally involves the use of expensive and complicated equipment. The need for cooling prevents previously developed tunneling hot-electron transistors from achieving commercial viability and widespread use.

Another disadvantage of previously developed hot-electron transistors is that they experience high leakage currents at temperatures approaching room temperature that prevent achieving the desired gain. Presently developed tunneling hot-electron transistors, therefore, do not provide the desired performance at room temperature.

Hot-electron transistors utilizing a double-tunnel barrier or resonant-tunnel barrier for injecting the hot-electrons from the emitter into the base have also been developed. Resonant-tunneling hot-election transistors have been shown to operate at room temperature. However, gain characteristics of resonant-tunneling hot-election transistors at room temperature are a strong function of bias voltage which precludes their use in many applications.

Transistors utilizing high energy band gap materials to create hot-electrons have been previously developed. These transistors do not rely on tunnel barrier transport generation of the hot-electrons, but present a difficult material system that is hard to reproduce resulting in poor yields.

SUMMARY OF THE INVENTION

Therefore, a need has arisen for a tunneling hot-electron transistor which operates at room temperature. An additional need exists for a tunneling hot-electron transistor that does not experience high leakage currents at room temperature but provides the desired gain at room temperature. A need exists for a tunneling hot-electron transistor that can be produced with acceptable yields.

In accordance with the present invention, a tunneling hot-electron transistor is provided which substantially eliminates or reduces disadvantages and problems associated with previously developed tunneling hot-electron transistors.

The present tunneling hot-electron transistor is formed on a substrate having an outer surface. The present transistor includes a subcollector layer comprising Indium Gallium Arsenide formed outwardly from the outer surface of the substrate. A collector barrier layer comprising Indium Aluminum Gallium Arsenide is outwardly formed from the subcollector layer. The collector barrier layer minimizes leakage current in the transistor. Outwardly from the collector barrier layer is formed a base layer comprising Indium Gallium Arsenide. A tunnel injector layer comprising Aluminum Arsenide for ballistically transporting electrons in the transistor is outwardly formed from the base layer. An emitter layer comprising Indium Aluminum Arsenide (or Indium Aluminum Gallium Arsenide) is outwardly formed from the tunnel injector layer completing the present tunneling hot-electron transistor.

Moreover, a collector contact, a base contact, and an emitter contact are formed outwardly from the collector, base, and emitter respectively to provide connections to the present tunneling hot-electron transistor.

A technical advantage of the present tunneling hot-electron transistor is that it provides the same advantages of currently available hot-electron transistors but operates at room temperature.

Another technical advantage of the present tunneling hot-electron transistor is its small size which allows the transistor to be integrated into high density circuits.

An additional technical advantage of the tunneling hot-electron transistor of the present invention is the high speed and high gain that it provides. Additionally, the present transistor operates at low operating voltages, thereby making it a low-power device.

Additionally, the tunneling hot-electron transistor of the present invention provides a technical advantage of being fabricated and manufactured using currently available methodologies. This in turn provides a technical advantage of high yield, that in turn, results in low relative cost for the present tunneling hot-electron transistor.

BRIEF DESCRIPTION OF THE DRAWINGS

For a more complete understanding of the present invention and advantages thereof, reference is now made to the following description taken in conjunction with the accompanying drawings in which like reference numbers indicate like features and wherein.

DETAILED DESCRIPTION OF THE INVENTION

Embodiments of the present invention are illustrated in the FIGUREs, like numerals being used to refer to like and corresponding parts of the various drawings.

Figure 1:
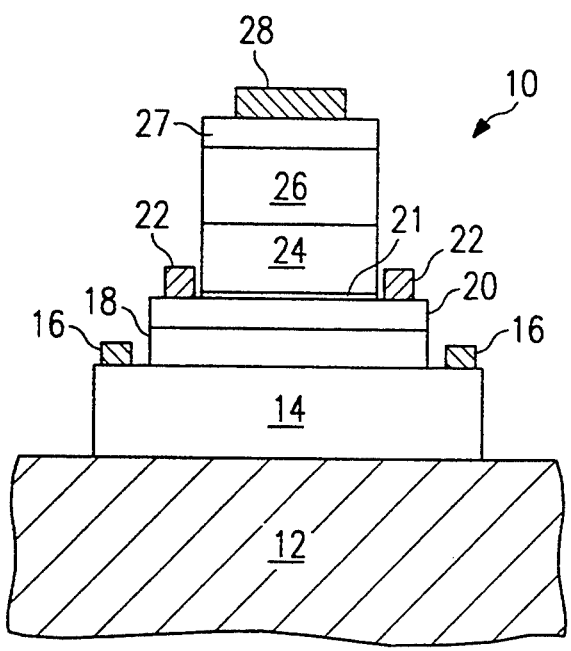
FIG. 1 is a cross-sectional diagram of the present tunneling hot-electron transistor.

FIG. 1 is a cross-sectional diagram of tunneling hot-electron transistor 10 constructed according to the teachings of the present invention. Tunneling hot-electron transistor 10 is referred to as a stacked structure because it is built vertically and conduction of carriers occurs vertically through the structure. The emitter, base and subcollector layers in tunneling hot-electron transistor 10 are similarly doped, as opposed to comprising N-type and P-type materials, making tunneling hot-electron transistor 10 a unipolar device. In the example of tunneling hot-electron transistor 10 of FIG. 1, the emitter, base, and subcollector layers are all doped using N-type impurities.

Material selection is very important in the manufacture of tunneling hot-electron transistor 10. In general, Group III and Group V semiconductor materials are used. Arsenic is the group V constituent material and various Group III compounds including Indium, Aluminum, and Gallium complete the material selection. The careful alteration of the material proportions during the formation of device 10 results in layers with differing conduction band energy levels that provide the junctions in the present tunneling hot-electron transistor.

Tunneling hot-electron transistor 10 of FIG. 1 is formed on an Indium Phosphide (InP) substrate 12. Collector or subcollector 14 is formed outwardly from substrate 12. Subcollector 14 may comprise, for example, on the order of 5000 Å of Indium Gallium Arsenide (InGaAs) with the respective mole concentrations of 53, 47 and 100, i.e., a ratio of 53 Indium atoms for every 47 Gallium atoms and for every 100 Arsenic atoms. Subcollector 14 is doped with N-type impurities to a concentration on the order of $5 \times 10^{18}$ ions/cm$^3$.

Formed outwardly from subcollector 14 are collector contacts 16. Collector contacts 16 may be, for example, a Titanium (Ti) layer formed outwardly from subcollector 14, a Platinum (Pt) layer formed outwardly from the Ti layer, and a Gold (Au) layer formed outwardly from the Pt layer.

A collector barrier 18 is formed outwardly from subcollector 14. Collector barrier 18, for example, consists on the order of 2500 Å of intrinsic Indium Aluminum Gallium Arsenide (InAlGaAs) in the respective mole concentrations of 52, 30, 18, and 100. Collector barrier 18 is a key element to the room temperature operation of tunneling hot-electron transistor 10. By manipulating the mole concentrations of Al and Ga in collector barrier 18, the band gap energy level for collector barrier 18 may be established at a sufficiently high level to prevent base-collector leakage current at room temperature in transistor 10. The mole concentrations of collector barrier 18 and the remaining layers in transistor 10 can be exactly controlled during their formation by forming these layers using molecular beam epitaxy (MBE).

Base 20 is formed outwardly from collector barrier 18. Base 20 may be formed to comprise, for example, on the order of 400 Å of InGaAs with mole concentrations of 53, 47 and 100, doped with N-type impurities to a concentration on the order of $1 \times 10^{18}$ ions/cm$^3$. The material used to form base 20 is essentially the same as the material of collector 14. An alternative strained layer InGaAs base with, the respective mole concentrations of 58, 42 and 100 has also been found to provide suitable performance. The material composition of base 20 is important in setting the band gap energy level of the electrons in base 20 at a low energy state while at room temperature. A low energy state for the electrons in base 20 is important in preventing leakage current in tunneling hot-electron transistor 10. Base contacts 22 may be, for example, a layer of Palladium (Pd) outwardly formed from base 20, a Germanium (Ge) layer outwardly formed from the Pd layer, and a Au layer outwardly formed from the Ge layer.

Tunnel injector 21 is formed outwardly from base 20 of hot-electron transistor 10 of FIG. 1. Tunnel injector 21 is generally less than 30 Å. Tunnel injector 21 generally comprises, for example, intrinsic Aluminum Arsenide (AlAs).

An Emitter 24 is formed outwardly from tunnel injector 21. Emitter 24 includes, for example, on the order of 1500 Å of Indium Aluminum Arsenide (InAlAs) with respective mole concentrations of 52, 48 and 100, doped with N-type impurities to a concentration on the order of $5 \times 10^{17}$ ions/cm$^3$. An alternative InAlGaAs emitter with the respective mole concentrations of 52, 40, 8 and 100 and similar dopant concentration has also provided acceptable performance.

Outwardly from emitter 24 is formed emitter grading 26 comprising on the order of 500 Å of InAlAs compositionally graded to InGaAs with respective mole concentrations of 52, 48 and 100, doped with N-type impurities to a concentration on the order of $5 \times 10^{18}$ ions/cm$^3$. Emitter pre-contact 27 on the order of 1000 Å of InGaAs with respective mole concentrations of 53, 47 and 100 is located outwardly from emitter grading 26, doped with N-type impurities to a concentration on the order of $5 \times 10^{18}$ ions/cm$^3$. Emitter grading 26 and emitter pre-contact 27 may be required to provide a surface to which a metal contact can be made, as it may be difficult to provide a metal contact directly on InAlAs emitter 24. Therefore, emitter grading 26 compositionally changes from InAlAs at the interface between emitter 24 and emitter grading 26, to InGaAs at the interface between emitter grading 26 and emitter pre-contact 27. Emitter pre-contact 27 ensures that a good electrical contact can be made to emitter contact 28. Emitter contact 28 is formed of Ti, Pt, and Au layers as previously described for collector contacts 16.

As described previously, the various layers and structures of tunneling hot-electron transistor 10 of FIG. 1 can be formed by MBE. MBE is a well-developed processing methodology that provides the present tunneling hot-electron transistor with a repeatable manufacturing process with good yields.

Figure 2:
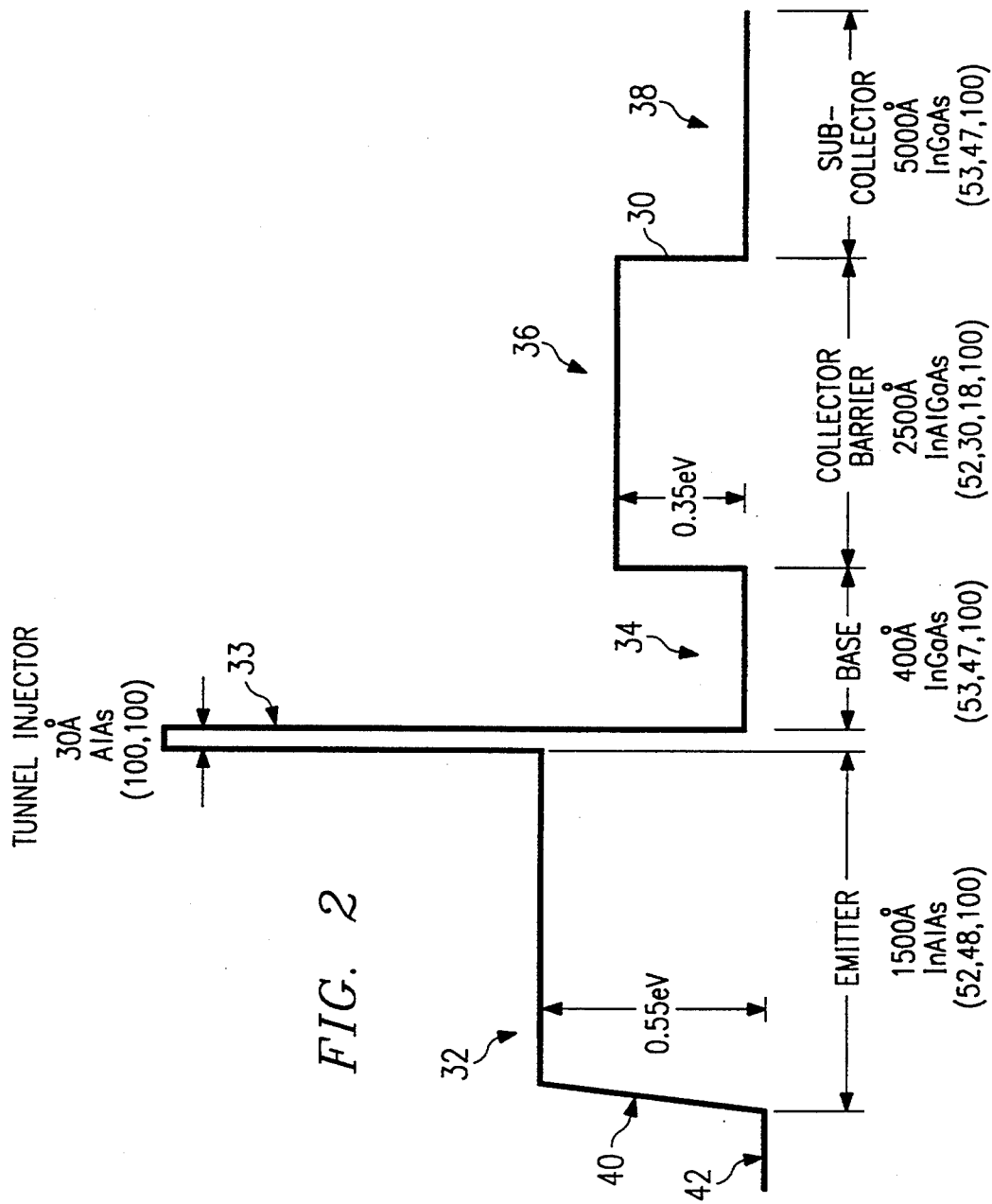
FIG. 2 depicts a conduction band diagram for the present tunneling hot-electron transistor.

FIG. 2 is a conduction band diagram that illustrates the operation of tunneling hot-electron transistor 10 of FIG. 1. Curve 30 of FIG. 2 represents the electron volt (eV) energy level of the electrons in the material within the different regions in tunneling hot-electron transistor 10. Note that the material compositions and dimensions previously described in accordance with FIG. 1 have been carried over to FIG. 2. FIG. 2 shows a two-dimensional relationship between the layers of tunneling hot-electron transistor 10 and the associated energy levels. Emitter region 32 corresponds to emitter 24 of FIG. 1. Tunnel injector region 33 corresponds to tunnel injector 21 of FIG. 1. Base region 34 corresponds to base 20 of FIG. 1. Collector barrier region 36 corresponds to collector barrier 18 of FIG. 1. Subcollector region 38 corresponds to subcollector 14 of FIG. 1. Additionally, slanted region 40 of curve 30 corresponds to emitter grading 26 of FIG. 1, and flat region 42 of curve 30 corresponds to emitter pre-contact 27 of FIG. 1.

FIG. 2 aids in explaining the room temperature operation of tunneling hot-electron transistor 10 of the present invention. The approximate energy of the conduction electrons in emitter region 32 is 0.55 eV. Base region 34 has a material composition such that its conduction electrons are at a sufficiently low energy level that they are not prone to leakage out of base 20 at room temperature. This low energy level aids in preventing leakage current in transistor 10. The composition of collector barrier region 36 has been designed to provide a sufficiently high barrier to the electrons in base region 34. The high energy level represented by collector barrier region 36 also aids in minimizing leakage current in tunneling hot-electron transistor 10. In the example transistor shown in FIG. 2, the difference in energy between the electrons in base region 34 and collector barrier region 36 has been established at 0.35 eV. This difference has been found to be sufficient to aid in preventing leakage current in transistor 10.

Tunneling hot-electron transistor 10 also includes tunnel injector region 33. The materials of tunnel injector region 33 are selected so that they impart high energy to the electrons travelling through region 33.

In operation of hot-electron transistor 10, electrons in emitter region 32 are excited upon applying a potential between base contact 22 and emitter contact 28. Approximately 0.2 to 0.3 V will cause the electrons in emitter region 32 to be drawn into tunnel injector region 33. Tunnel injector region 33 aligns the electron flux angular distribution towards the vertical direction and, thus, increases the probability for ballistic electron transport across base region 34. The electrons from emitter region 32 tunnel through tunnel injector region 33 where they are ballistically transported or injected into base region 34 providing hot-electrons. The energy level of the electrons upon leaving tunnel injector region 33 must be high enough to sustain the electrons across base region 34. Electrons with insufficient energy will fall into base region 34 before reaching collector barrier region 36 or collector region 38.

Additionally, the energy level of the electrons leaving tunnel injector region 33 must be below the next higher conduction band energy level (approximately 0.6 eV) for the electrons in base region 34. If the energy level of the electrons injected into base region 34 is too high, the injected electrons may be prone to inter-valley scattering at the next higher energy level in base region 34. The base to emitter potential and width of tunnel injector 30 ensure a substantial number of electrons injected into base region 34 are at the appropriate energy level so that they may travel to collector barrier region 36.

It was previously believed that once tunnel injector region 33 injected the hot-electrons into base region 34, that inter-valley scattering with the base region 34 electrons would prevent the majority of injected electrons from reaching collector region 38. It is now known that a gaussian percentage, sometimes as high as 93%, of the tunneling electrons from tunnel injector region 33 have sufficient energy to cross base region 34 to collector region 38.

Inter-valley scattering in transistor 10 is minimized by controlling the room temperature energy level of the electrons in base region 34. The lower energy level of the electrons in base region 34 prevents the diversion of the injected electrons from tunnel injector region 33 by inter-valley scattering. The injected electrons are collected at collector barrier region 36 and transferred to subcollector region 38.

As the voltage increases across collector contact 16 to emitter contact 28, current is pulled out of base contact 22. Once the collector to emitter voltage reaches a predetermined level, transistor 10 turns on causing an increase in the amount of current pulled out of base 20. As the amount of base current increases, the need to supply more high energy electrons to thermalize down the base current increases. Injecting the hot-electrons from emitter 24 using tunnel injector 21 provides the necessary high energy electrons for achieving a higher collector to emitter gain for transistor 10.

Figure 3:
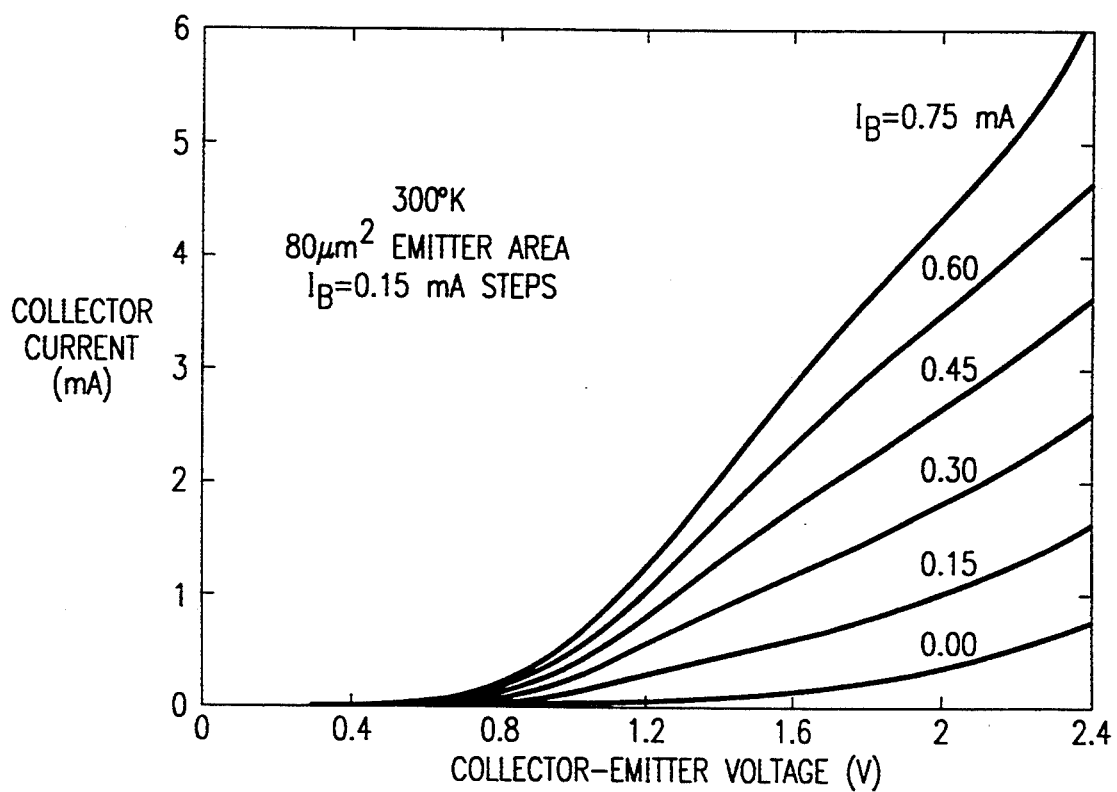
FIG. 3 shows the corresponding common-emitter transistor characteristics of the present tunneling hot-electron transistor at room temperature.

FIG. 3 shows the corresponding common emitter transistor characteristics of an example hot-electron transistor of the present invention. The curves of FIG. 3 show the collector current in relation to collector-emitter voltage at various base currents while an exemplary hot-electron transistor was at room temperature or 300° K. Gain is measured as the ratio of collector current to base current. An example of the gain achievable at room temperature with the present hot-electron transistor is as shown in FIG. 3; for a base current of 0.75 mA at a collector-emitter voltage of approximately 2.4 V, a gain of approximately 7 is achieved.

In summary, a general design methodology and proof of operation has been described for developing a room temperature tunneling hot-electron transistor. The design methodology described provides a tunneling hot-electron transistor including a collector barrier having sufficient conduction band energy so that thermal electrons are confined within the base of the transistor at room temperature. Through appropriate material selection for the emitter and tunnel injector of the transistor, electrons ballistically injected by the tunnel injector into the base and across to the collector have energy lower than the energy at which inter-valley scattering occurs in the base, but greater than the collector barrier conduction band energy.

The present tunneling hot-electron transistor provides an important technical advantage of being operational at room temperature. Example applications for the present transistor include providing voltage gain and noise margin for room temperature logic circuits. The present hot-electron transistor provides additional technical advantages of small size, high gain, high speed, and low power consumption.

Although the present invention has been described in detail, it should be understood that various changes, substitutions, and alterations can be made hereto without departing from the spirit and scope of the invention as defined by the appended claims.

What is claimed is:

1. A hot-electron transistor formed on a substrate having an outer surface, comprising:
   a collector barrier outwardly from the outer surface of the substrate and a base outwardly from said collector barrier, wherein said collector barrier has sufficient conduction band energy so that thermal electrons are confined within said base of the transistor at room temperature; and
   a tunnel injector outwardly from said base and an emitter outwardly from said tunnel injector, said emitter having an unbiased conduction band energy greater than that of both said base and said collector barrier, said tunnel injector being formed of a single barrier for ballistically injecting electrons from said emitter into said base and to said collector barrier at an energy level lower than the energy at which inter-valley scattering occurs in said base but greater than the collector barrier conduction band energy.

2. The hot-electron transistor of claim 1, wherein said collector barrier comprises Indium Aluminum Gallium Arsenide, said base layer comprises Indium Gallium Arsenide, said tunnel injector comprises Aluminum Arsenide, and said emitter comprises Indium Aluminum Arsenide.

3. The hot-electron transistor of claim 1, wherein said tunnel injector is less than 30 Å.

4. A hot-electron transistor formed on a substrate having an outer surface, comprising:
- a subcollector layer comprising Indium Gallium Arsenide outwardly from the outer surface of the substrate;
- a collector barrier layer comprising Indium Aluminum Gallium Arsenide outwardly from said collector layer for minimizing leakage current from the transistor;
- a base layer comprising Indium Gallium Arsenide outwardly from said collector barrier layer;
- a single tunnel injector layer comprising Aluminum Arsenide outwardly from said base layer for ballistically transporting electrons in the transistor; and
- an emitter layer comprising Indium Aluminum Arsenide outwardly from said tunnel injector layer.

5. The hot-electron transistor of claim 4 wherein the Indium Gallium Arsenide mole concentrations of said subcollector layer are 53, 47, and 100, respectively.

6. The hot-electron transistor of claim 4 wherein the Indium Aluminum Gallium Arsenide mole concentrations of said collector barrier layer are 52, 30, 18, and 100, respectively.

7. The hot-electron transistor of claim 4 wherein the Indium Gallium Arsenide mole concentrations of said base layer are 53, 47, and 100, respectively.

8. The hot-electron transistor of claim 4 wherein the Indium Gallium Arsenide mole concentrations of said base layer are 58, 42, and 100, respectively.

9. The hot-electron transistor of claim 4 wherein the Aluminum Arsenide mole concentrations of said tunnel injector layer are 100 and 100, respectively.

10. The hot-electron transistor of claim 4 wherein the Indium Aluminum Arsenide mole concentrations of said emitter layer are 52, 48, and 100, respectively.

11. The hot-electron transistor of claim 4 further comprising a collector contact comprising a Titanium layer outwardly from said subcollector layer, a Platinum layer outwardly from said Titanium layer, and a Gold layer outwardly from said Platinum layer.

12. The hot-electron transistor of claim 4 further comprising a base contact comprising a Palladium layer outwardly from said base layer, a Germanium layer outwardly from said Palladium layer, and a Gold layer outwardly from said Germanium layer.

13. The hot-electron transistor of claim 4 further comprising an emitter contact comprising a Titanium layer outwardly from said emitter layer, a Platinum layer outwardly from said Titanium layer, and a Gold layer outwardly from said Platinum layer.

14. The hot-electron transistor of claim 4 wherein said emitter layer comprises Indium Aluminum Gallium Arsenide.

15. The hot-electron transistor of claim 4 wherein said emitter layer comprises Indium Aluminum Gallium Arsenide with mole concentrations of 52, 40, 8, and 100, respectively.

16. The hot-electron transistor of claim 4 wherein the depth of said tunnel injector layer is less than 30 Å.

17. A hot-electron transistor of claim 4 further comprising an emitter grading layer compositionally graded from Indium Aluminum Arsenide to Indium Gallium Arsenide outwardly from said emitter layer.

18. The hot-electron transistor of claim 4 further comprising:
- an emitter grading layer compositionally graded from Indium Aluminum Arsenide to Indium Gallium Arsenide outwardly from said emitter layer; and
- an emitter pre-contact layer comprising Indium Gallium Arsenide outwardly from said emitter grading layer.

* * * * *